United States Patent [19]
Dierschke et al.

[11] Patent Number: 6,121,104
[45] Date of Patent: Sep. 19, 2000

[54] CHARGE CANCELLATION TECHNIQUE FOR INTEGRATED CIRCUIT RESISTORS

[75] Inventors: Eugene G. Dierschke, Dallas; Norman Culp, Plano, both of Tex.

[73] Assignee: Texas Instruments Incorporated, Dallas, Tex.

[21] Appl. No.: 09/301,410

[22] Filed: Dec. 12, 1997

Related U.S. Application Data

[62] Division of application No. 08/989,610, Dec. 12, 1997, Pat. No. 6,005,280.

[51] Int. Cl.[7] .................. H01L 21/8234; H01L 21/8244; H01L 21/20
[52] U.S. Cl. .................. 438/382; 438/238; 438/384; 438/385
[58] Field of Search ..................... 257/904, 924, 257/379, 380, 516, 528, 533, 536; 438/238, 59, 98, 382, 384, 385, FOR 429

[56] References Cited

U.S. PATENT DOCUMENTS

| | | | |
|---|---|---|---|
| 4,428,066 | 1/1984 | Kihara et al. | 365/95 |
| 4,904,951 | 2/1990 | Molina et al. | 330/107 |
| 5,182,220 | 1/1993 | Ker et al. | 437/34 |
| 5,214,497 | 5/1993 | Nanba et al. | 257/528 |
| 5,493,254 | 2/1996 | Fairgrieve | 330/260 |
| 5,903,033 | 5/1999 | Suwa | 257/358 |
| 5,986,307 | 11/1999 | Yu | 257/360 |
| 5,986,867 | 11/1999 | Duvvury et al. | 361/111 |
| 5,991,134 | 11/1999 | Tan et al. | 361/56 |

*Primary Examiner*—Mary Wilczewski
*Assistant Examiner*—James Park
*Attorney, Agent, or Firm*—April M. Mosby; W. James Brady; Frederick J. Telecky, Jr.

[57] ABSTRACT

An integrated circuit resistor (18) has a layout in which a first parasitic capacitance (26) exists between first portions of the resistor (18) and a first integrated circuit feature (34), and a second parasitic capacitance (28) exists between second portions of the resistor and a second integrated circuit feature (32). The resistor (18) may have, for example, a zigzag or serpentine configuration, with portions of each leg of the zigzag configuration overlying the first and second integrated circuit features (34,32). The first and second integrated circuit features (34,32) are configured to produce substantially canceling charges on the first and second parasitic capacitances (26,28). The resistor may be defined by a doped semiconductor material, such as a polysilicon layer. The resistor may be used in many applications, such as a feedback resistor of an optoelectronic current-to-voltage converter (12).

17 Claims, 1 Drawing Sheet

CHARGE CANCELLATION TECHNIQUE FOR INTEGRATED CIRCUIT RESISTORS

This application is a division of Ser. No. 08/989,610 filed Dec. 12, 1997, now U.S. Pat. No. 6,005,280.

BACKGROUND OF THE INVENTION

1. Field of the Invention

This invention relates to improvements in methods and structures for reducing capacitive effects on integrated circuit resistors, or the like, and in a particular embodiment to improvements in optoelectronic current-to-voltage converter sensors and methods for making and using same.

2. Relevant Information

In the construction of integrated circuits, one structure in which resistors are made is a stripe in a layer that is formed during an integrated circuit fabrication process. For example, such resistor may be formed from a doped region in a polycrystalline silicon (polysilicon) layer, one or more of which are typically found in silicon integrated circuit fabrication processes. Such resistors may be of significant lengths, and are usually laid out in a zigzag or serpentine pattern to conserve chip area. The resistance of the resistor is a function of the length and width of the stripe as well as of the levels of dopants within the stripe.

Such resistors can be considered in the same manner as a transmission line, having a distributed resistance and capacitance along its length. The capacitance referred to is generally thought of as a parasitic capacitance between the resistor and the semiconductor substrate above which the resistor is formed, although other capacitances also may have capacitance contributions, depending upon the particular circuit embodiment in which the resistor exists. For example, a capacitance may exist between the various portions or segments of the resistor in its zigzag layout; however, such capacitances are usually of lesser importance than the resistor-to-substrate capacitance mentioned above.

Although examples of such integrated circuit resistors are manifold, one example of such resistor which is widely used is in sensors in optoelectronic applications, such as a current-to-voltage converter sensor in which a feedback resistor, $R_F$, is connected between the output of an operational amplifier and its inverting input. The cathode of a photodiode is connected to the inverting input of the operational amplifier, and the anode is connected to the non-inverting input of the operational amplifier and to ground.

In this sensor embodiment, photodiode current, $I_L$, is generated when light is incident on the photodiode. The photodiode current flows through the feedback resistor, $R_F$, generating an output voltage $V_{OUT}$ equal to $(I_L)(R_F)$. This circuit configuration, which may be constructed as an integrated circuit on a semiconductor substrate, provides an output proportional to light input, except for offsets due to normal operational amplifier offset and finite operational amplifier gain. The circuit minimizes the absolute voltage across the photodiode, which minimizes photodiode leakage currents, especially at high temperatures. The circuit also minimizes the effect of the photodiode capacitance on speed.

When the operational amplifier and feedback resistor of optoelectronic light-to-voltage converters are integrated onto a semiconductor substrate, typically the feedback resistor has a resistance of up to 16MΩ and is constructed using a second polysilicon level having a resistivity of 500Ω/□, for example, in a LinBiCMOS[TM 1] process. A limitation on the sensor speed is the parasitic capacitance between the polysilicon feedback resistor and the substrate. Such parasitic capacitance between the resistor and substrate severely limits the bandwidth of the sensor.

[1] LinBiCMOS is a Trademark of Texas Instruments Incorporated

In the past, the general solution for high bandwidth sensors has been to use an external resistor to minimize the parasitic capacitance of the resistor. However, such external solutions increase the size and cost of the sensor.

What is needed, therefore, is a method and apparatus to minimize the effect of the parasitic capacitances of integrated circuit resistors.

SUMMARY OF THE INVENTION

In light of the above, therefore, it is an object of the invention to provide a method and apparatus to minimize the effects of parasitic capacitances of integrated circuit resistors.

It is another object of the invention to provide a method and apparatus to minimize the effects of the parasitic capacitance of an integrated polysilicon feedback resistor in an integrated optoelectronic light-to-voltage converter.

These and other objects, features and advantages of the invention will be apparent to those skilled in the art from the following detailed description of the invention, when read in conjunction with the accompanying drawings and appended claims.

Thus, according to a broad aspect of the invention an integrated circuit resistor is presented. The resistor has a layout in which a first parasitic capacitance exists between first portions of the resistor and a first integrated circuit feature, and a second parasitic capacitance exists between second portions of the resistor and a second integrated circuit feature. The resistor may have, for example, a zigzag or serpentine configuration, with portions of each leg of the zigzag configuration overlying the first and second integrated circuit features. The first and second integrated circuit features are configured to produce substantially canceling charges on the first and second parasitic capacitances.

In one embodiment, the resistor is defined by a doped region in a layer of semiconductor material, for example, in a polysilicon layer. The doping level of the doped region defines the extent and resistivity of the integrated circuit resistor. In such embodiment, the substrate may be of P conductivity type, the first feature may be an NWELL in the substrate connected to source charge to the first parasitic capacitance, and the second feature may be an NWELL in the substrate connected to sink charge from the second parasitic capacitance.

According to another broad aspect of the invention, a method is presented for reducing parasitic capacitive effects on an integrated circuit resistor. The resistor may be, for example, of the type formed in a doped region in a layer of semiconductor material. The method includes locating first segments of the integrated circuit resistor in proximity to a first integrated circuit feature so that a first parasitic capacitance exists between the first segments and the first integrated circuit feature, and locating second segments of the integrated circuit resistor in proximity to a second integrated circuit feature so that a second parasitic capacitance exists between the second segments and the second integrated circuit feature. The steps of locating the first and second segments of the integrated circuit resistor may include forming the first and second segments in a zigzag configuration in overlying or in proximity to the first and second integrated circuit features. The first and second integrated circuit features are biased to produce substantially canceling charges on the first and second parasitic capacitances.

The resistor may be constructed in a substrate of P conductivity type, and the method may additionally include selecting the first feature to be an NWELL in the substrate connected to source charge to the first parasitic capacitance, and selecting the second feature to be an NWELL in the substrate connected to sink charge from the second parasitic capacitance.

According to another broad aspect of the invention, a current-to-voltage converter is presented, which is integrated onto a semiconductor substrate. The converter includes an amplifier having an output and at least one input, and a resistor connected between the output and the input of the amplifier. The resistor is also connected to receive an input current to produce an input voltage for the amplifier. The resistor is configured in a conductive layer of the integrated circuit and has a layout in which a first parasitic capacitance exists between the resistor and a first integrated circuit feature, and a second parasitic capacitance exists between the resistor and a second integrated circuit feature. The first and second integrated circuit features are selected to produce substantially canceling charges on the first and second parasitic capacitances.

The substrate may be of P conductivity type. The first feature may be an NWELL in the substrate connected to the output of the amplifier, and the second feature may be an NWELL in the substrate connected to the inverting input of the amplifier. The resistor, which may be configured in a zigzag pattern, may be formed of a doped region of a polysilicon layer.

According to yet another broad aspect of the invention, a method is presented for converting current-to-voltage. The method includes constructing an amplifier having an output and at least one input in a semiconductor substrate, and constructing a resistor between the output and the input of the amplifier. The resistor is connected to receive an input current to produce an input voltage for the amplifier. The resistor is configured in a layer of the integrated circuit with a layout in which a first parasitic capacitance exists between the resistor and a first integrated circuit feature and a second parasitic capacitance exists between the resistor and a second integrated circuit feature. The first and second integrated circuit features are selected to produce substantially canceling charges on the first and second parasitic capacitances.

According to still another broad aspect of the invention, an optoelectronic current-to-voltage converter is presented that is integrated onto a semiconductor substrate. The converter includes an amplifier having inverting and noninverting inputs and an output, the noninverting input are connected to a substrate ground. A photodiode is connected between the inverting and noninverting inputs of the amplifier, and a feedback resistor is connected between the output and the inverting input of the amplifier. The resistor is configured of a conductive layer of the integrated circuit, and has a layout in which a first parasitic capacitance exists between the resistor and a first integrated circuit feature and a second parasitic capacitance exists between the resistor and a second integrated circuit feature. The first and second integrated circuit features are selected to produce substantially canceling charges on the first and second parasitic capacitances.

According to still yet another broad aspect of the invention, a method is presented for converting an optical signal to a voltage. The method includes constructing in a semiconductor substrate an amplifier having inverting and noninverting inputs and an output. The noninverting input is connected to a substrate ground. A photodiode is constructed in the substrate between the inverting and noninverting inputs of the amplifier, and a feedback resistor is connected between the output and the inverting input of the amplifier. The resistor is configured of a conductive layer of the integrated circuit and has a layout in which a first parasitic capacitance exists between the resistor and a first integrated circuit feature, and a second parasitic capacitance exists between the resistor and a second integrated circuit feature. The first and second integrated circuit features are selected to produce substantially canceling charges on the first and second parasitic capacitances.

BRIEF DESCRIPTION OF THE DRAWINGS

The aforementioned and other features and objects of the present invention and the manner of attaining them will become more apparent, and the invention itself will be best understood, by reference to the following description of a preferred embodiment take in conjunction with the accompanying drawings, wherein.

In the various figures of the drawing, like reference numerals are used to denote like or similar parts.

DETAILED DESCRIPTION OF THE PREFERRED EMBODIMENTS

It should be noted that the process steps and structures herein described do not necessarily form a complete process flow for manufacturing integrated circuits. It is anticipated that the present invention may be practiced in conjunction with integrated circuit fabrication techniques currently used in the art, and only so much of the commonly practiced process steps are included as are necessary for an understanding of the present invention.

The solution enables on-chip resistors for high bandwidth applications. Such resistors result in lower system cost, improved electrical noise immunity, and lower leakage currents, since the input circuit node need not extend outside the package. One example of the use of such integrated circuit resistors is in optoelectronic current-to-voltage converter sensors in which a feedback resistor is employed in an operational amplifier circuit that converts current from a photodiode to an output voltage.

According to a preferred embodiment of the invention, two NWELLs are used under the feedback resistor, one connected to a charge source and the other connected to a charge sink. For example, in a sensor embodiment, one of the NWELLs may be connected to the substrate and the other NWELL connected to the sensor output.

As mentioned, large resistors are very long and are generally made in a zigzag or serpentine configuration, with many physically parallel segments. The various segments can be considered to be connected electrically in series. A portion of each segment is designed to overlie the NWELL which is connected to substrate, and a portion of each segment is over the NWELL which is connected to the sensor output. The relative portion over each type of NWELL depends on the relative position of the segment in the total feedback resistor, and, according to the invention, the positions are chosen to further a goal of achieving substantially exact charge cancellation. Although exact charge cancellation might not be repeatably achievable due to the design tolerances of the circuit and other factors, a sufficiently exact cancellation might be achieved through the techniques herein described to fulfill the particular circuit requirements under consideration.

Figure 1:
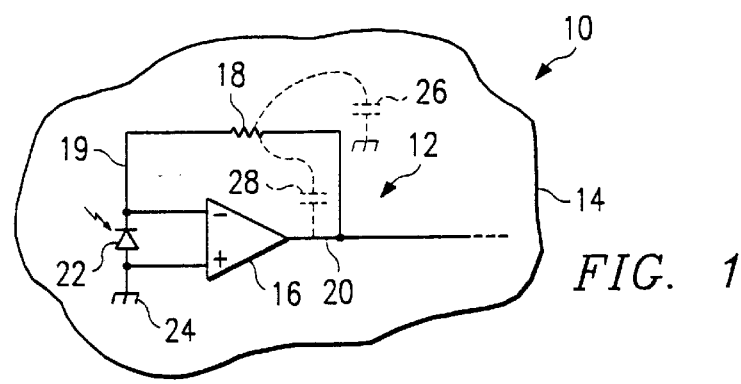
FIG. 1 is an electronic schematic diagram showing a generalized view of an optoelectronic current to voltage converter sensor in accordance with a preferred embodiment of the invention.

The charge cancellation technique used for such integrated circuit resistor is shown in FIG. 1 in an embodiment in which the resistor provides a polysilicon feedback resistor in an optoelectronic current-to-voltage converter sensor. More particularly, an electrical schematic diagram of an embodiment 10 of an optoelectronic current to voltage sensor circuit 12 that is integrated onto a semiconductor substrate 14, in accordance with a preferred embodiment of the invention, is shown in FIG. 1. The optoelectronic current-to-voltage converter sensor circuit 12 includes an operation amplifier 16 that is integrated into the semiconductor substrate 14. A feedback resistor 18 is connected between the output from the integrated circuit 16 on line 20 and its inverting input on line 19.

A photodiode 22, which is also integrated onto the semiconductor substrate 14, is connected between the inverting and noninverting inputs of the operational amplifier 16. The noninverting input of the operational amplifier 16 is also connected to substrate ground 24. As will become apparent, the feedback resistor 18 is configured with respect to the underlying doped and biased features in the substrate 14 Th to provide a parasitic capacitance 26 between portions of the feedback resistor 18 and the substrate ground, and to provide a parasitic capacitance 28 between other portions of the feedback resistor 18 and the output line 20, in such a manner that the effects of the parasitic capacitors 26 and 28 cancel.

Figure 2:
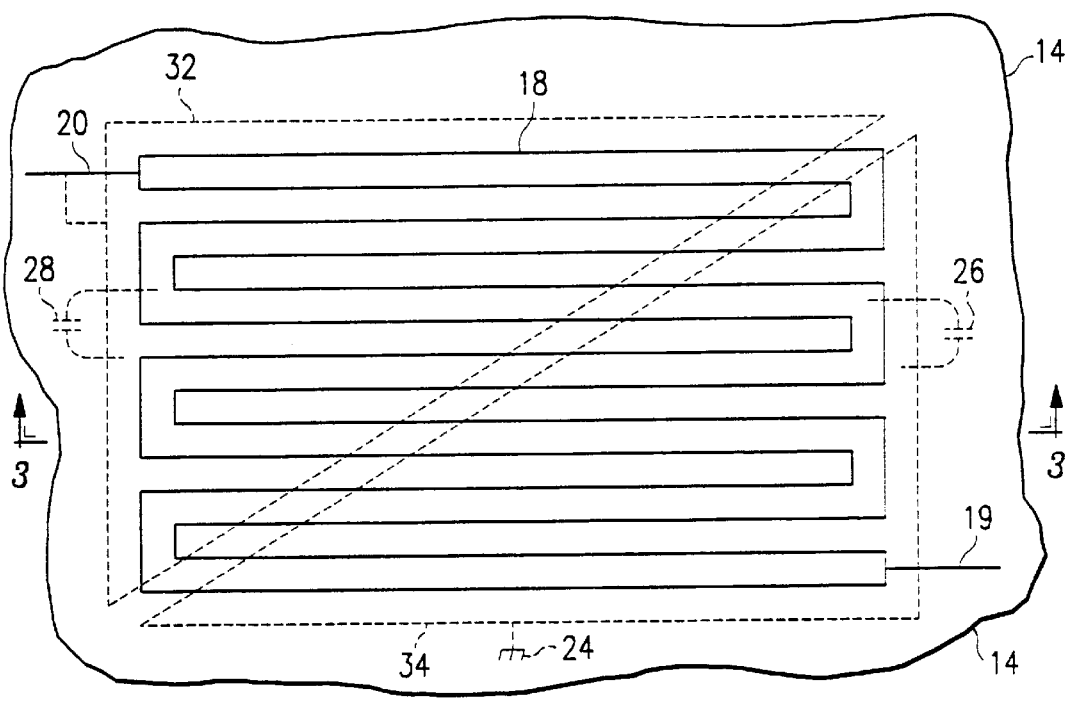
FIG. 2 is a top view of an embodiment of a layout for the feedback resistor of FIG. 1 in relation to the respective NWELLs formed in the underlying substrate, in accordance with a preferred embodiment of the invention.

With reference additionally now to FIG. 2, a top view of a feedback resistor 18 is shown, illustrating its layout a with respect to the corresponding underlying doped and biased NWELL structures 32 and 34 in a substrate 14, and showing the resulting parasitic capacitances 26 and 28 between the resistor 18 and NWELL structures 32 and 34. In the physical layout of one embodiment of the feedback resistor 18, the feedback resistor 18 is constructed, for example, of polysilicon that is etched to form the desired resistor pattern. In a LinBiCMOS™ process, one integrated circuit fabrication process which may be used, without limitation thereto, the polysilicon pattern may be a second polysilicon layer, referred to as "POLY2", and the resistor 18 may be a region that has been masked, etched, and doped, for example, by a blanket implant before etching or by a localized implant after etching, to provide a serpentine conductive layer having a resistivity of 500 Ω/□. One end of the resistor 18 is connected to the inverting input of the operational amplifier 16 on line 19, and the other end is connected to the output of the operational amplifier 16 on line 20.

It should be noted that although the process for constructing the circuit 12 is described as a LinBiCMOS™ process, the LinBiCMOS™ process is used for example only, and it is not intended to limit the invention thereto. The principles of the invention may be practiced in conjunction with virtually any semiconductor integrated circuit process.

As shown, the resistor 18 is formed over two NWELL regions 32 and 34 that are formed in the substrate 14. More particularly, the layout of the resistor 18 is designed so that one-half of the resistor overlies the NWELL 32 and the other one-half overlies the NWELL 34. The NWELL 32 is electrically connected to the output of the operational amplifier 16 on line 20. Additionally, the NWELL 34 is connected to the substrate ground 24.

The NWELLs 32 and 34 may be formed in the substrate concurrently with the formation of other NWELLs, for example during the substrate preparation for subsequent fabrication of PMOS transistors therein. One advantage of the use of NWELLs is that the PN junction between the NWELLs and a P+ type substrate provides effective isolation between the NWELLs and the substrate.

Figure 3:
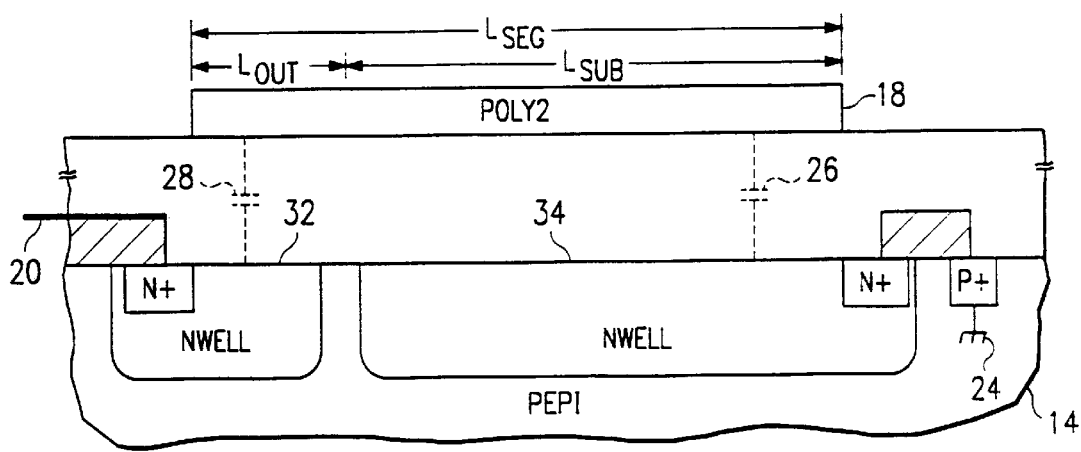
FIG. 3 is a cross-sectional view, taken at 3—3 in FIG. 2, showing the relationship of the feedback resistor to the respective output and substrate ground NWELLs, in accordance with a preferred embodiment of the invention.

With reference additionally now to FIG. 3, a cross-sectional view taken at 3—3 in FIG. 2 is shown, illustrating the vertical spatial relationship of a portion of the feedback resistor 18 with respect to the underlying NWELLs 32 and 34. The feedback resistor 18 is formed of a polysilicon layer, which, as mentioned, may be a second polysilicon layer (POLY2) that is formed in a LinBiCMOS™ process. Intermediate layers between the second polysilicon layer and the substrate 14 have been omitted for clarity. Normally there is a dielectric oxide layer between the polysilicon layer and the NWELLs. Also shown in the drawing of FIG. 3 are the physical dimensions used in the mathematical formulas set forth hereinbelow, wish respect to the physical relationship between the resistor segments in the polysilicon layer and the underlying NWELL layers 32 and 34.

More particularly:

$L_{SEG}$=Length of a Polysilicon Resistor Segment.

F=Fraction indicating the position of resistor segment relative to total resistor length. Low values of F indicates segments near the input end 19. High values of F indicates segments near the output end 20.

$L_{OUT}$=($L_{SEG}$)(F)=Portion of the resistor segment over the NWELL 32 connected to the output 20.

$L_{SUB}$=($L_{SEG}$)(1−F)=Portion of resistor segment over the NWELL 34 connected to substrate ground, GND 24.

$V_{SEG}$=($V_{OUT}$)(F)=Average voltage of a resistor segment.

$C_P$=Parasitic capacitance of the polysilicon resistor 18 per unit length.

$C_{OUT}$=($C_P$)($L_{OUT}$)=($C_P$)($L_{SEG}$)(F)
  =parasitic capacitance of the portion of the polysilicon feedback resistor segment over the NWELL 32 connected to the output 20.

$C_{SUB}$=($C_P$)($L_{SUB}$)=($C_P$)($L_{SEG}$)(1−F)
  =parasitic capacitance of portion of the polysilicon feedback resistor segment over the NWELL 34 connected to substrate ground, GND 24.

Delta $QC_{OUT}$=change of charge on capacitor $C_{OUT}$ from initial $V_{OUT}$=0.
  =($V_{SEG}$−$V_{OUT}$)($C_{OUT}$)
  =($V_{OUT}$)(F−1)($C_P$)($L_{SEG}$)(F)
  =−($V_{OUT}$)($C_P$)($L_{SEG}$)(F)(1−F)

Delta $QC_{SUB}$=change of charge on capacitor $C_{SUB}$ from initial $V_{OUT}$=0.
  =($V_{SEG}$)($C_{SUB}$)
  =($V_{OUT}$)(F)($C_P$)($L_{SEG}$)(1−F)
  =($V_{OUT}$)($C_P$)($L_{SEG}$)(F)(1−F)

Thus, it can be seen that the delta changes of the charges of the two capacitors are exactly of the same magnitude, and are of opposite polarity. Therefore, charge cancellation occurs, and the effect of the parasitic capacitance is greatly reduced.

A circuit analysis of an integrated sensor in LinBiCMOS™ with a photodiode capacitance of 120 pF, a 500 Ω/□ POLY2 resistor width of 24 μm, a POLY2 to POLY2 spacing of 2 μm, and an ideal 20 MHz operational amplifier indicates the sensor bandwidth is greatly increased:

4 KHz without this charge cancellation

31 KHz with charge cancellation

33 KHz assuming zero POLY2 parasitic capacitance.

The connection of the NWELL 34 to substrate ground, as described in the invention is not essential. The same result can be obtained for parasitic capacitances directly to the substrate. But an NWELL is generally placed under the POLY feedback resistor for use as a dummy photodiode to collect carriers generated by light incident on the feedback resistor region. METAL2 is usually used over rest of the sensor integrated circuit, except over the photodiode, as a light shield to prevent carriers generated by the light from interacting with the analog circuitry. Generally METAL2 is not used over the polysilicon feedback resistor region because of the parasitic capacitance between the polysilicon resistor and the METAL2 layer.

Furthermore, the invention described above indicates use of NWELL for charge cancellation. But other layers could also be used, for example, N+S/D, EMITTER, NCOL, POLY1, etc. The invention can also be used for other types of resistors besides polysilicon resistors, for example, thin metal film resistors. The invention can also be used to minimize the effect of parasitic capacitances to layers above the feedback resistor, for example, a METAL2 light shield.

Although the invention has been described in conjunction with a process using e substrates, the invention can also be used in N substrate processes in which PWELL, P+S/D, BASE, and so forth, could be used for layers under the resistor.

Although the invention has been described and illustrated with a certain degree of particularity, it is understood that the present disclosure has been made only by way of example, and that numerous changes in the combination and arrangement of parts can be resorted to by those skilled in the art without departing from the spirit and scope of the invention, as hereinafter claimed.

What is claimed is:

1. A method for reducing parasitic capacitive effects on an integrated circuit resistor, comprising:

locating first segments of said integrated circuit resistor in proximity to a first integrated circuit feature, whereby a first parasitic capacitance exists between said first segments and said first integrated circuit feature;

locating second segments of said integrated circuit resistor in proximity to a second integrated circuit feature, whereby a second parasitic capacitance exists between said second segments and said second integrated circuit feature; and biasing said first and second integrated circuit features to produce substantially canceling charges on said first and second parasitic capacitances.

2. The method of claim 1 further comprising providing a substrate of P conductivity type, selecting said first feature to be an NWELL in said substrate connected to source charge to said first parasitic capacitance, and selecting said second feature to be an NWELL in said substrate connected to sink charge from said second parasitic capacitance.

3. The method of claim 1 wherein said steps of locating said first and second segments of said integrated circuit resistor comprises forming said first and second segments in a polysilicon layer.

4. The method of claim 1 wherein said steps of locating said first and second segments of said integrated circuit resistor comprises forming said first and second segments in a zigzag configuration.

5. A method for converting current-to-voltage, comprising:

constructing an amplifier having an output and at least one input in a semiconductor substrate;

constructing a resistor between said output and said input of said amplifier, connecting said resistor to receive an input current to produce an input voltage for said amplifier; and configuring said resistor in a layer of said integrated circuit with a layout in which a first parasitic capacitance exists between said resistor and a first integrated circuit feature and a second parasitic capacitance exists between said resistor and a second integrated circuit feature, said first and second integrated circuit features being selected to produce substantially canceling charges on said first and second parasitic capacitances.

6. The method of claim 5 further providing a P conductivity type substrate, forming said first feature as an NWELL in said substrate connected to the output of said amplifier, and forming said second feature as an NWELL in said substrate connected to the inverting input of said amplifier.

7. The method of claim 5 wherein said step of constructing a resistor comprises forming said resistor in a polysilicon layer.

8. The method of claim 5 wherein step of constructing a resistor comprises forming said resistor in a doped region of a polysilicon layer.

9. The method of claim 5 wherein said step of constructing a resistor comprises forming said resistor in a zigzag configuration.

10. The method of claim 5 wherein said step of configuring said resistor comprises locating a first length of said resister in proximity to said first feature and locating said second length of said resistor in proximity to a second feature.

11. A method for converting an optical signal to a voltage, comprising:

constructing in a semiconductor substrate an amplifier having inverting and noninverting inputs and an output, said noninverting input being connected to a substrate ground;

constructing a photodiode in said substrate between the inverting and noninverting inputs of said amplifier;

a feedback resistor connected between said output and said inverting input of said amplifier;

said resistor configured of a conductive layer of said integrated circuit and having a layout in which a first parasitic capacitance exists between said resistor and a first integrated circuit feature and a second parasitic capacitance exists between said resistor and a second integrated circuit feature, said first and second integrated circuit features being selected to produce substantially canceling charges on said first and second parasitic capacitances.

12. The method of claim 11 wherein said substrate is of P conductivity type, said first feature is an NWELL in said substrate connected to the output of said amplifier, and said second feature is an NWELL in said substrate connected to the substrate ground.

13. The method of claim 11 wherein said resistor is formed in a polysilicon layer.

14. The method of claim 11 wherein said resistor is formed of a doped region of a polysilicon layer.

15. The method of claim 11 wherein said resistor is formed in a zigzag configuration.

16. The method of claim 11 wherein said a first length of said resistor is located in proximity to said first feature and said second length of said resistor is located in proximity to a second feature.

17. The method of claim 16 wherein said a first and second lengths of said resistor are substantially equal.

* * * * *

UNITED STATES PATENT AND TRADEMARK OFFICE
CERTIFICATE OF CORRECTION

PATENT NO. : 6,121,104
DATED : September 19, 2000
INVENTOR(S) : Eugene G. Dierschke and Norman Culp It is certified that error appears in the above-identified patent and that said Letters Patent is hereby corrected as shown below:

<u>Title page,</u>
Item [22], should read -- Date Filed: 04/28/1999 --

Signed and Sealed this

Seventeenth Day of June, 2003

JAMES E. ROGAN
*Director of the United States Patent and Trademark Office*